(12) United States Patent
Kanaya et al.

(10) Patent No.: US 7,672,087 B2
(45) Date of Patent: Mar. 2, 2010

(54) MAGNETORESISTIVE EFFECT ELEMENT HAVING BIAS LAYER WITH INTERNAL STRESS CONTROLLED

(75) Inventors: Takayasu Kanaya, Chuo-ku (JP);
Katsuki Kurihara, Chuo-ku (JP);
Tetsuya Kuwashima, Chuo-ku (JP)

(73) Assignee: TDK Corporation, Nihonbashi, Chuo-ku, Tokyo (JP)

( * ) Notice: Subject to any disclaimer, the term of this patent is extended or adjusted under 35 U.S.C. 154(b) by 528 days.

(21) Appl. No.: 11/691,653

(22) Filed: Mar. 27, 2007

(65) Prior Publication Data
US 2008/0239582 A1    Oct. 2, 2008

(51) Int. Cl.
*G11B 5/39* (2006.01)

(52) U.S. Cl. .............................. 360/324.1; 360/324.11; 360/324.12

(58) Field of Classification Search ...... 360/324–324.2; 428/810–816; 257/421–427; 365/158, 145, 365/171–173
See application file for complete search history.

(56) References Cited

U.S. PATENT DOCUMENTS 6,970,332 B2 * 11/2005 Tetsukawa et al. ....... 360/324.1

FOREIGN PATENT DOCUMENTS

| JP | 2005-044490 | 2/2005 |
| JP | 2005-056538 | 3/2005 |
| JP | 2005-346869 | 12/2005 |

* cited by examiner

*Primary Examiner*—A. J. Heinz
(74) *Attorney, Agent, or Firm*—Frommer Lawrence & Haug LLP

(57) ABSTRACT

Provided is an MR effect element in which the magnetization of the pinned layer is stably fixed even after going through high temperature process. The MR effect element comprises: a non-magnetic intermediate layer; a pinned layer and a free layer stacked so as to sandwich the non-magnetic intermediate layer; an antiferromagnetic layer stacked to have a surface contact with the pinned layer, for fixing a magnetization of the pinned layer to a direction in-plane of the pinned layer and perpendicular to a track width direction; and hard bias layers provided on both sides in the track width direction of the free layer, for applying a bias field to the free layer, a product $\lambda_S \times \sigma$ of a saturation magnetostriction constant $\lambda_S$ of the pinned layer and an internal stress $\sigma$ on a cross-section perpendicular to a layer surface of the hard bias layer being negative.

16 Claims, 6 Drawing Sheets

Fig. 1
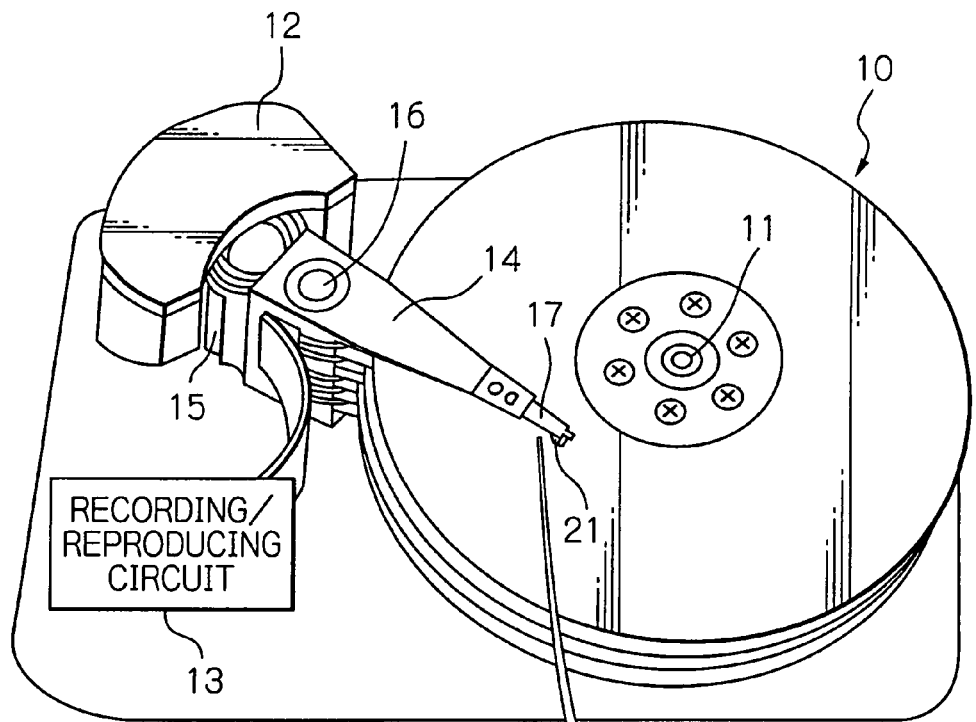
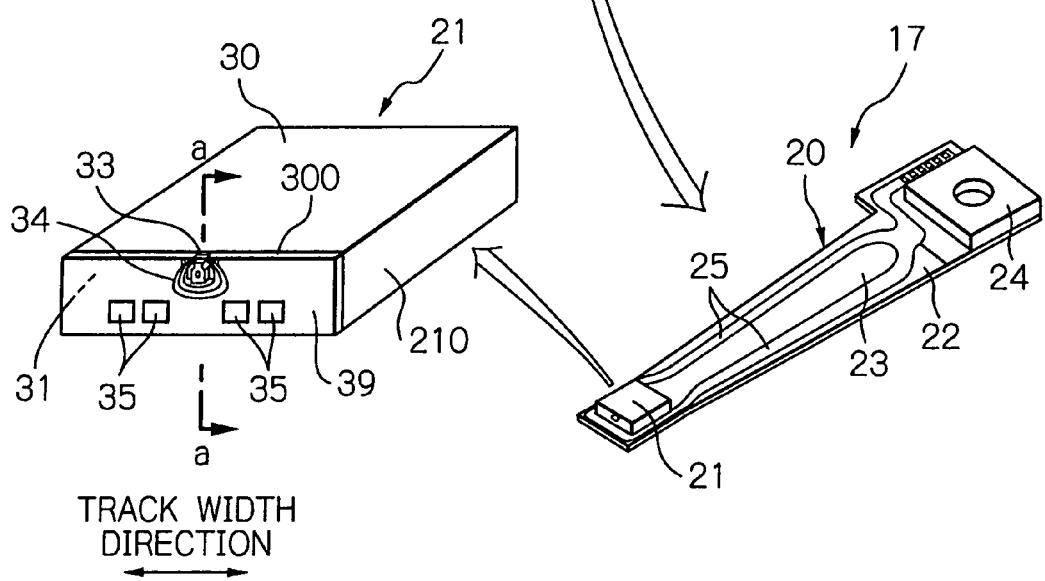
TRACK WIDTH DIRECTION

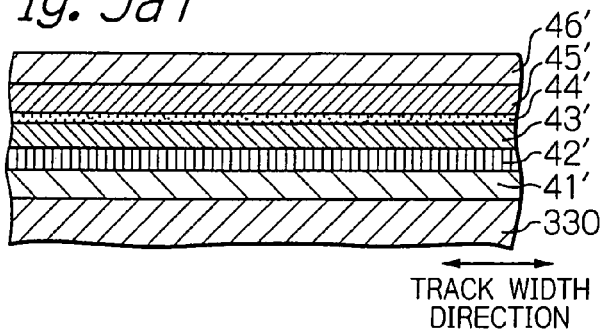
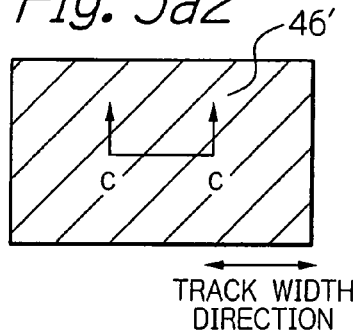
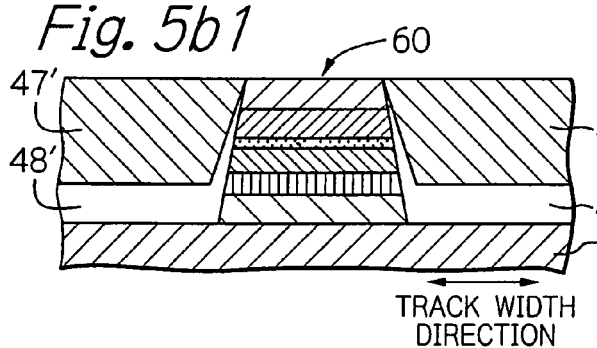
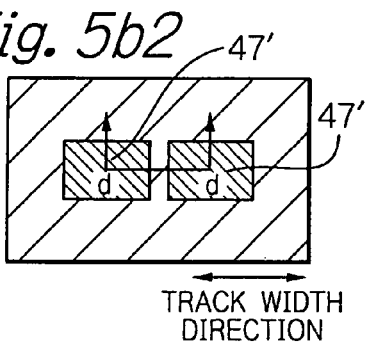
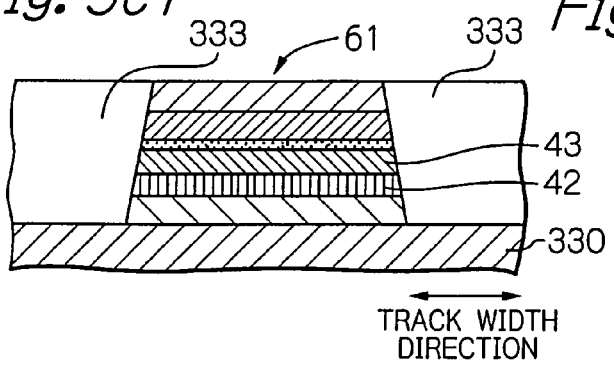
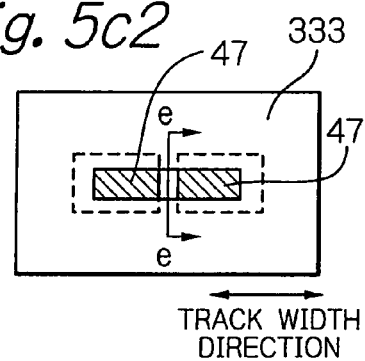
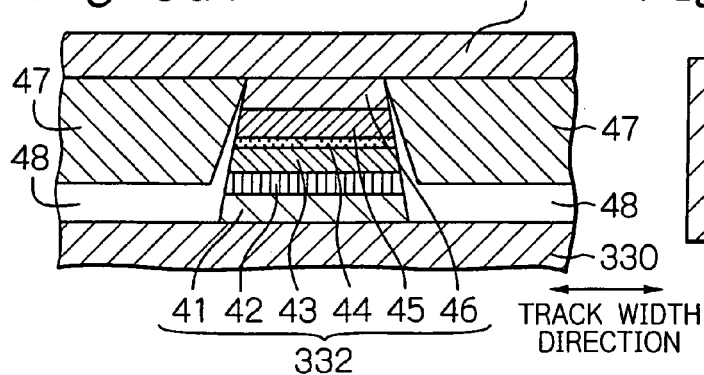
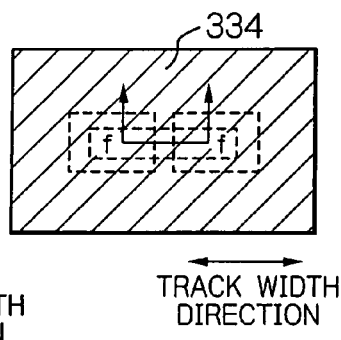

US 7,672,087 B2

MAGNETORESISTIVE EFFECT ELEMENT HAVING BIAS LAYER WITH INTERNAL STRESS CONTROLLED

BACKGROUND OF THE INVENTION

1. Field of the Invention

The present invention relates to a magnetoresistive (MR) effect element that provides an output based on resistance change according to the intensity of a signal magnetic field, a thin-film magnetic head including the MR effect element, a head gimbal assembly (HGA) provided with the thin-film magnetic head, and a magnetic recording/reproducing apparatus provided with the HGA.

2. Description of the Related Art

As magnetic recording/reproducing apparatuses as represented by magnetic disk drive apparatuses increase in capacity and reduce in size, thin-film magnetic heads are required to have higher sensitivity and larger output. To respond to the requirement, a giant magnetoresistive (GMR) effect element and a tunnel magnetoresistive (TMR) effect element have been developed, which can detect extremely local signal magnetic field and provide significantly high resistance-change ratio. Actually, in thin-film magnetic heads having the element as a read head element for reading data, output characteristics of the heads are being intensively developed.

The MR effect elements such as the above-described TMR and GMR effect elements have a magnetization-pinned layer (pinned layer) and a magnetization-free layer (free layer) which are two ferromagnetic layers opposed to each other so as to sandwich a non-magnetic intermediate layer. The magnetization direction of the pinned layer is fixed due to the exchange coupling with an antiferromagnetic layer having a surface contact with the pinned layer on the opposite side to the non-magnetic intermediate layer. On the other hand, the magnetization direction of the free layer can change according to a signal magnetic field generated from a magnetic recording medium. In this configuration, the signal magnetic field is detected by measuring the element resistance variation as a function of the magnetization direction of the free layer.

Therefore, in developing the element output characteristics such as an output intensity and the symmetry of output waveform, it has been one of most significant problems to appropriately control the magnetization directions of respective constituent layers above-described.

Generally, as for the magnetization direction of the free layer, it is important to apply an appropriate bias magnetic field to the free layer so that the magnetic domains of the free layer is stabilized and an output responding linearly to the signal magnetic field is obtained. As a method for applying the bias magnetic field, generally used is an abutted junction biasing method. In the method, bias layers formed of a hard-magnetic material are disposed near both ends in the track width direction of the free layer, and then a bias magnetic field in the track width direction is applied to the free layer. The abutted junction biasing method can cause the magnetic domains of the free layer to be stabilized effectively because both end portions in the track width direction of the free layer, which are most affected by demagnetizing field, can receive most amount of bias magnetic field.

In the meanwhile, the magnetization of the pinned layer is usually fixed to the direction in-plane of the pinned layer and perpendicular to the track width direction through a pin-annealing process. When the magnetization of the pinned layer is rotated to be tilted from the just perpendicular direction or is dispersed, a problem is likely to occur that sufficient element output cannot be obtained or that the symmetry of the output waveform is degraded. Against the problem, conventionally, many measures with respect to the pin-annealing process have been devised, as described, for example, in Japanese Patent Publication No. 2005-56538A.

However, even if the magnetization of the pinned layer was fixed by a predetermined pin-annealing process, there has been a problem that the magnetization may be rotated or dispersed by annealing afterward under the condition of narrower read gap required for the recent higher density recording. Here, the read gap is defined as a distance between two shield layers sandwiching a magneto-sensitive portion of the MR effect element. The read gap tends to be narrower so that an extremely local signal magnetic field can be detected.

Actually, in the wafer thin-film process of the head manufacture, an electromagnetic coil element for writing data is usually formed after forming the MR effect element. The formation process of the electromagnetic coil element involves an annealing step with significantly high temperature. Further, in the machine process in which the wafer substrate that has gone through the wafer thin-film process is separated into individual sliders, various annealing processes are performed. The high temperature environment in these annealing processes causes the exchange coupling between the antiferromagnetic layer and the pinned layer to be weakened. The decrease in the coupling force becomes more significant especially when the thickness of the antiferromagnetic layer becomes smaller according to narrowing the read gap. As a result, even if the magnetization of the pinned layer was fixed by a predetermined pin-annealing process, there has been a case that the magnetization is rotated or dispersed through the annealing afterward, so that the element output decreases and the symmetry of the output waveform is degraded.

BRIEF SUMMARY OF THE INVENTION

Therefore, an object of the present invention is to provide an MR effect element in which the magnetization of the pinned layer is stably fixed even after going through high temperature process under the condition that the read gap becomes narrower, a thin-film magnetic head including the MR effect element, an HGA provided with the thin-film magnetic head, and a magnetic recording/reproducing apparatus provided with the HGA.

Before describing the present invention, terms used herein will be defined. In a multilayer structure of element(s) formed on/above the element formation surface of the substrate in a thin-film magnetic head, a layer or a portion of the layer located on the substrate side (the element formation surface side) in relation to a standard layer is referred to as being located "lower" than, "beneath" or "below" the standard layer, and a layer or a portion of the layer located on the stacking direction side (the opposite side to the substrate) in relation to a standard layer is referred to as being located "upper" than, "on" or "above" the standard layer.

According to the present invention, an MR effect element is provided, which comprises: a non-magnetic intermediate layer formed of a non-magnetic material; a pinned layer formed of a ferromagnetic material and a free layer formed of a ferromagnetic material, the pinned layer and the free layer stacked so as to sandwich the non-magnetic intermediate layer; an antiferromagnetic layer stacked to have a surface contact with the pinned layer, for fixing a magnetization of the pinned layer to a direction in-plane of the pinned layer and perpendicular to a track width direction; and hard bias layers provided on both sides in the track width direction of the free layer, for applying a bias field to the free layer, a product $\lambda_S \times \sigma$ of a saturation magnetostriction constant $\lambda_S$ of the pinned layer and an internal stress $\sigma$ on a cross-section perpendicular to a layer surface of the hard bias layer being negative. Here, it is preferable that an absolute value $|\lambda_S \times \sigma|$ of the product $\lambda_S \times \sigma$ is 1040 J/m$^3$ or more.

The negative product $\lambda_S \times \sigma$ is provided in either case of that the saturation magnetostriction constant $\lambda_S$ of the pinned layer is positive and the hard bias layer has a compressive stress ($\sigma<0$) or that the saturation magnetostriction constant $\lambda_S$ of the pinned layer is negative and the hard bias layer has a tensile stress ($\sigma>0$). In each case, the pinned layer receives an anisotropic magnetic field in-plane of its own layer and perpendicular to the track width direction due to inverse-magnetostriction effect and shape magnetic anisotropy. The direction of the anisotropic magnetic field is just the direction in which the magnetization of the pinned layer should be fixed through pin-annealing process. As a result, the magnetization of the pinned layer is stably fixed even after going through high temperature environment such as annealing. Consequently, a sufficient element output and favorable symmetry of output waveform are surely obtained.

In the above-described MR effect element, it is also preferable that the pinned layer has a positive saturation magnetostriction constant $\lambda_S$, and the hard bias layer has a compressive internal stress on a cross-section perpendicular to the layer surface. In the preferable case, it is more preferable that the positive saturation magnetostriction constant $\lambda_S$ of the pinned layer is $2\times10^{-6}$ or more, and the compressive internal stress of the hard bias layer has an absolute value of 520 MPa or more.

Further, in the above-described MR effect element, it is also preferable that bias insulating layers formed of a non-magnetic electrically-insulating material are provided between respective the hard bias layers and a multilayer of the pinned layer, the non-magnetic intermediate layer and the free layer. Further, a bias base film formed of an element selected from a group of Cr, Ti, W or Mo or an alloy of at least two selected from the group is preferably provided as a base of the hard bias layer. Furthermore, the MR effect element is preferably a current-perpendicular-to-plane GMR (CPP-GMR) effect element or a TMR effect element, in which a sense current flows in a direction perpendicular to surfaces of stacked layers of the element.

According to the present invention, a thin-film magnetic head is further provided, which comprises the above-described MR effect element for reading data.

According to the present invention, an HGA is further provided, which comprises: the above-described thin-film magnetic head; signal lines for the above-described MR effect element; and a support means for supporting the thin-film magnetic head.

According to the present invention, a magnetic recording/reproducing apparatus is further provided, which comprises: at least one HGA described above; at least one magnetic recording medium; and a recording/reproducing means for controlling read and write operations of the above-described thin-film magnetic head to the at least one magnetic recording medium.

Further objects and advantages of the present invention will be apparent from the following description of preferred embodiments of the invention as illustrated in the accompanying figures. In each figure, the same element as that shown in other figure is indicated by the same reference numeral.

Further, the ratio of dimensions within an element and between elements becomes arbitrary for viewability.

BRIEF DESCRIPTION OF THE SEVERAL VIEWS OF THE DRAWINGS

FIG. 1 shows perspective views schematically illustrating a configuration of an embodiment of a magnetic recording/reproducing apparatus, an HGA and a thin-film magnetic head according to the present invention;

FIGS. 5a1 to 5d2 show cross-sectional and plain views schematically illustrating an embodiment of the manufacturing method of the MR effect element according to the present invention.

DETAILED DESCRIPTION OF THE INVENTION

Figure 2:
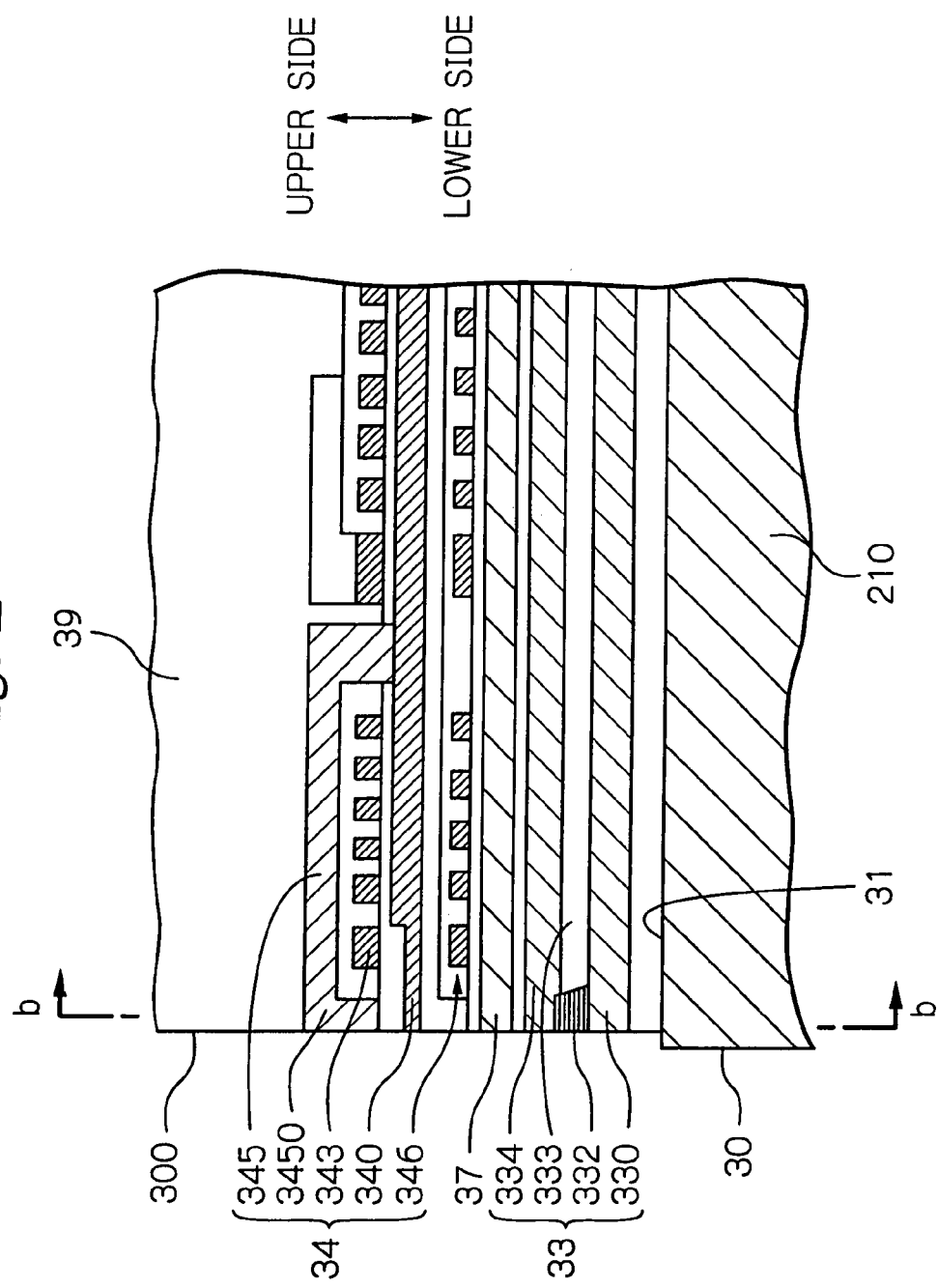
FIG. 2 shows a cross-sectional view taken along line a-a in FIG. 1 schematically illustrating a main portion of the thin-film magnetic head.

FIG. 1 shows perspective views schematically illustrating a configuration of an embodiment of a magnetic recording/reproducing apparatus, an HGA and a thin-film magnetic head according to the present invention. In magnified views of the HGA and the thin-film magnetic head of FIG. 1, the side opposed to a magnetic disk is turned upward.

The magnetic recording/reproducing apparatus shown in FIG. 1 is a magnetic disk drive apparatus, which includes multiple magnetic disks 10 as magnetic recording media that rotate about a spindle of a spindle motor 11, an assembly carriage device 12 provided with multiple drive arms 14, HGAs 17 each of which is attached on the end portion of each drive arm 14 and is provided with a thin-film magnetic head (slider) 21, and a recording/reproducing circuit 13 for controlling read/write operations.

The assembly carriage device 12 is provided for positioning the thin-film magnetic head 21 above a track formed on the magnetic disk 10. In the device 12, the drive arms 14 are stacked along a pivot bearing axis 16 and are capable of angular-pivoting about the axis 16 driven by a voice coil motor (VCM) 15. The numbers of magnetic disks 10, drive arms 14, HGAs 17, and thin-film magnetic heads 21 may be one.

While not shown, the recording/reproducing circuit 13 includes a recording/reproducing control LSI, a write gate for receiving data to be recorded from the recording/reproducing control LSI, an write circuit for outputting a signal from the write gate to an electromagnetic coil element for writing data, a constant current circuit for supplying a sense current to a MR effect element for reading data, an amplifier for amplifying output voltage from the MR effect element, and a demodulator circuit for demodulating the amplified output voltage and outputting reproduced data to the recording/reproducing control LSI.

Also as shown in FIG. 1, in the HGA 17, the thin-film magnetic head 21 is fixed and supported on the end portion of a suspension 20 in such a way to face the surface of each magnetic disk 10 with a predetermined spacing (flying height). And one end of a wiring member 25 is electrically connected to electrodes of the thin-film magnetic head 21. Here, the suspension 20 includes a load beam 22, an flexure 23 with elasticity fixed on the load beam 22, a base plate 24 provided on the base portion of the load beam 22, and a wiring member 25 that is provided on the flexure 23 and consists of lead conductors as signal lines and connection pads electrically connected to both ends of the lead conductors. While not shown, a head drive IC chip may be attached at some midpoints of the suspension 20.

Also as shown in FIG. 1, the thin-film magnetic head 21 includes: a slider substrate 210 having an air bearing surface (ABS) 30 processed so as to provide an appropriate flying height and an element formation surface 31; an MR effect element 33 as a read head element for reading data and an electromagnetic coil element 34 as a write head element for writing data which are formed on/above the element formation surface 31; an overcoat layer 39 formed so as to cover the MR effect element 33 and the electromagnetic coil element 34; and four signal electrodes 35 exposed in the upper surface of the overcoat layer 39. Here, the ABS 30 of the thin-film magnetic head 21 is opposed to the magnetic disk 10. And respective two of the four signal electrodes 35 are connected to the MR effect element 33 and the electromagnetic coil element 34.

One ends of the MR effect element 33 and the electromagnetic coil element 34 reach the head end surface 300 on the ABS 30 side. These ends face the surface of the magnetic disk 10, and then, a read operation is performed by sensing a signal magnetic field from the disk 10, and a write operation is performed by applying a write magnetic field to the disk 10. A predetermined area of the head end surface 300 that these ends reach may be coated with diamond like carbon (DLC), etc. as an extremely thin protective film.

FIG. 2 shows a cross-sectional view taken along line a-a in FIG. 1 schematically illustrating a main portion of the thin-film magnetic head 21. In the figure, the electromagnetic coil element 34 is for perpendicular magnetic recording. However, it may be an electromagnetic coil element for longitudinal magnetic recording, which has a write coil layer and upper and lower magnetic pole layers whose end portions on the head end surface side pinch a write gap layer.

In FIG. 2, the MR effect element 33 includes an MR effect multilayer 332, an insulating layer 333 covering at least the rear side surface of the multilayer 332, and a lower shield layer 330 and an upper shield layer 334 which sandwich the MR effect multilayer 332 and the insulating layer 333. The MR effect multilayer 332 senses a signal magnetic field from the magnetic disk with very high sensitivity, and changes its own electric resistance according to the intensity of the signal magnetic field. The upper and lower shield layers 334 and 330 play a role of shielding external magnetic fields that cause noise for the MR effect multilayer 332.

The MR effect multilayer 332 may be a current-in-plane (CIP) giant magnetoresistive (GMR) effect multilayer, a current-perpendicular-to-plane (CPP) GMR effect multilayer, or a tunnel magnetoresistive (TMR) effect multilayer. In the case that the MR effect multilayer 332 is a CIP-GMR effect multilayer, though not shown in the figure, upper and lower shield gap layers for insulation are provided between the MR effect multilayer 332 and respective upper and lower shield layers 334 and 330. Further, also though not shown in the figure, an MR lead conductor layer is formed for supplying the MR effect multilayer 332 with a sense current and bringing out reproduction output. On the other hand, in the case that the MR effect multilayer 332 is a CPP-GMR effect multilayer or a TMR effect multilayer, the upper and lower shield layers 334 and 330 also function as upper and lower electrodes for applying a sense current to the MR effect multilayer 332 in the direction perpendicular to layer surfaces thereof. In this case, the upper and lower shield gap layers and the MR lead conductor layer are not needed and are omitted.

The electromagnetic coil element 34 is for perpendicular magnetic recording in the present embodiment, and includes a main magnetic pole layer 340 formed of a soft-magnetic material such as NiFe (Permalloy), CoFeNi, CoFe, FeN or FeZrN, a write coil layer 343 formed of an conductive material such as Cu (copper), and an auxiliary magnetic pole layer 345 formed of a soft-magnetic material such as NiFe (Permalloy), CoFeNi, CoFe, FeN or FeZrN. The main magnetic pole layer 340 is a magnetic path for converging and guiding a magnetic flux excited by a write current flowing through the write coil layer 343 toward the record layer of the magnetic disk 10. The layer thickness of the end portion on the head end surface 300 side of the main magnetic pole layer 340 becomes smaller than that of the other portions. As a result, the main magnetic pole layer 340 can generate fine write fields corresponding to higher density recording. The write coil layer 343 has a monolayer structure in the present embodiment, however, may have a two or more layered structure or a helical coil shape. Further, the number of turns of the write coil layer 343 is not limited to that shown in FIG. 2.

The end portion in the head end surface 300 side of the auxiliary magnetic pole layer 345 becomes a trailing shield portion 3450 that has a layer cross-section larger than that of the other portions. The trailing shield portion 3450 causes the magnetic field gradient between the end portion of the trailing shield portion 3450 and the end portion of the main magnetic pole layer 340 to be steeper. As a result, a jitter of signal outputs becomes smaller, and therefore, an error rate during reading can be reduced.

In the present embodiment, the electromagnetic coil element 34 is provided with a backing coil portion 36 as well as the write coil layer 343. Further, an inter-element shield layer 37 is provided between the MR effect element 33 and the electromagnetic coil element 34. The backing coil portion 36 suppresses a wide area adjacent-track erase (WATE) behavior, which is an unwanted write or erase operation to the magnetic disk, by generating a magnetic flux for negating the magnetic flux loop that arises from the main magnetic pole layer 340 through the upper and lower shield layers 334 and 330 of the MR effect element 33.

Figure 3:
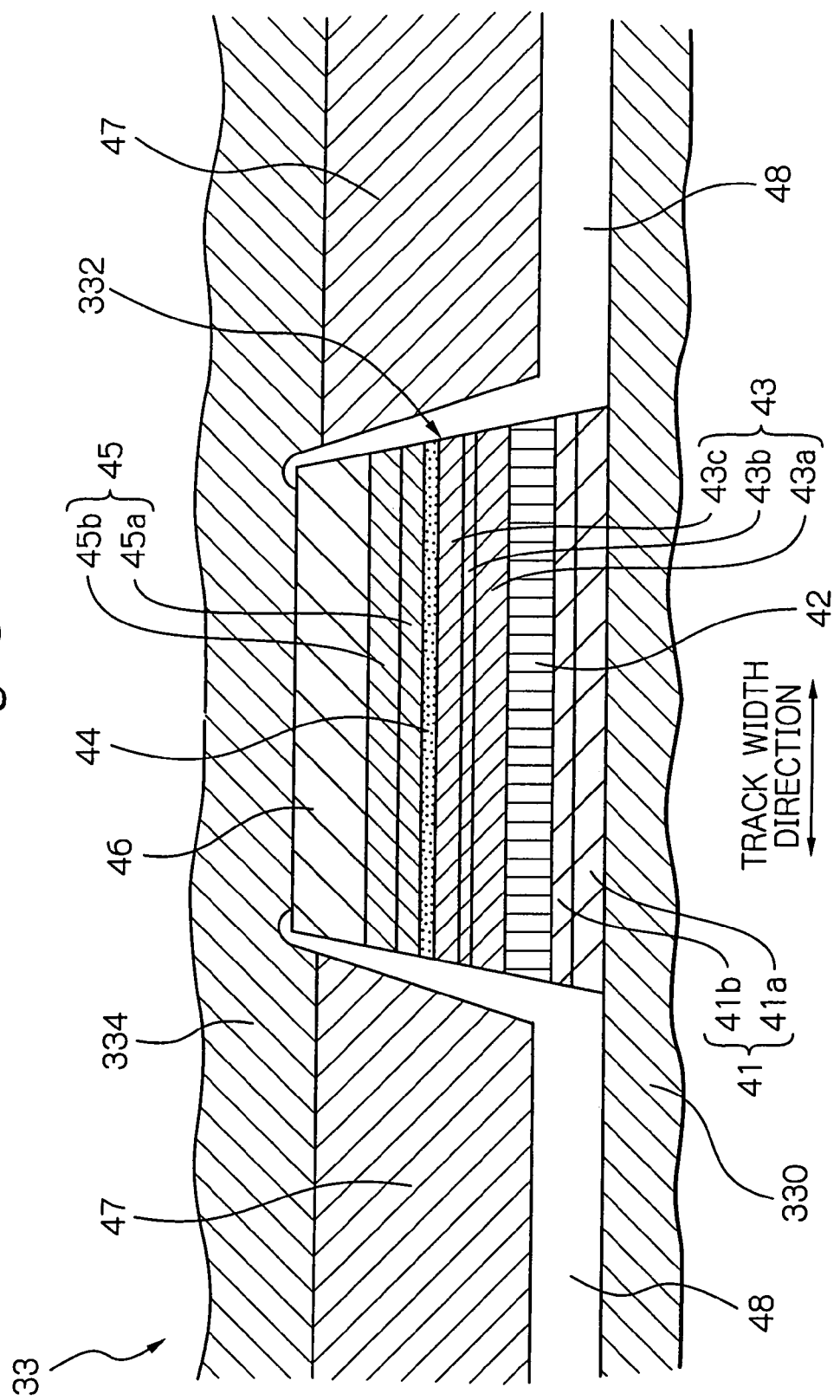
FIG. 3 shows a cross-sectional view taken along line b-b in FIG. 2 viewed from the head end surface side, schematically illustrating a main portion of an embodiment of the MR effect element.

FIG. 3 shows a cross-sectional view taken along line b-b in FIG. 2 viewed from the head end surface 300 side, schematically illustrating a main portion of an embodiment of the MR effect element 33.

In FIG. 3, the MR effect element 33 is provided with: an MR effect multilayer 332 sandwiched between the upper and lower shield layers 334 and 330; and hard bias layers 47 formed of a hard-magnetic material and provided on both sides in the track width direction of the MR effect multilayer 332 through a bias insulating layer 48.

The MR effect multilayer 332 is a CPP-GMR effect multilayer in the present embodiment, and has a multilayered structure in which sequentially stacked are: a base layer 41 formed of a conductive material; an antiferromagnetic layer 42 formed of an antiferromagnetic material; a pinned layer 43 formed mainly of a ferromagnetic material; a non-magnetic intermediate layer 44 formed of an non-magnetic metal; a free layer 45 formed of a ferromagnetic material; and a cap layer 46 formed of a conductive material. In the case that the MR effect multilayer 332 is a TMR effect multilayer, the non-magnetic intermediate layer is formed of a non-magnetic oxide.

The base layer 41 is provided on the lower shield layer 330, and has a stacked structure in which a lower metal film 41a and a base film 41b are stacked sequentially. The base layer 41 electrically connects the MR effect multilayer 332 to the lower shield layer 330. Further, the cap layer 46 electrically connects the MR effect multilayer 332 to the upper shield layer 334 by providing the upper shield layer 334 on the cap layer 46. Therefore, during detecting magnetic field, a sense current flows in the direction perpendicular to the surface of each stacked layer of the MR effect multilayer 332.

The antiferromagnetic layer 42 is provided on the base layer 41. The pinned layer 43 is provided on the antiferromagnetic layer 42, and has namely a synthetic-ferri-pinned structure in which a first ferromagnetic film 43a, a non-magnetic film 43b and a second ferromagnetic film 43c are sequentially stacked from the antiferromagnetic layer 42 side. The first ferromagnetic film 43a receives an exchange bias field due to the exchange interaction with the antiferromagnetic layer 42. As a result, the whole magnetization of the pinned layer 43 is stably fixed. In the actual element, the magnetization of the pinned layer 43 is fixed to the direction in-plane of the pinned layer 43 and perpendicular to the track width direction through a pin-annealing process. The free layer 45, which is provided on the non-magnetic intermediate layer 44, has a two-layered structure in which a high polarizability film 45a and a soft-magnetic film 45b are sequentially stacked from the non-magnetic intermediate layer 44 side.

Here, a case that the magnetization direction of the free layer 45 changes according to signal magnetic field will be considered. In the case, the direction of spins of conduction electrons in the free layer 45 also varies. Then, an inelastic scattering probability of the conduction electron at the interface with the non-magnetic intermediate layer 44 significantly depends on the angle formed between the spin direction and the magnetization direction of the pinned layer 43. As a result, the electric resistance of the MR effect multilayer 332 distinctly changes according to the direction of the signal magnetic field. The measurement of this resistance change enables a weak and local signal magnetic field to be detected with high sensitivity. Meanwhile, in the case that the MR effect multilayer 332 is a TMR effect multilayer, the pinned layer 43 and the free layer 45 make a ferromagnetic tunnel coupling with the non-magnetic intermediate layer 44 as a barrier of the tunnel effect. Thus, when the magnetization direction of the free layer 45 changes in response to a signal magnetic field, a tunnel current increases/decreases due to the variation in the state densities of up and down spin bands of the pinned layer 43 and the free layer 45, which changes the electric resistance of the MR effect multilayer 332. The measurement of this resistance change enables a weak and local signal field to be detected with high sensitivity.

Also in FIG. 3, the hard bias layers 47 are provided on both sides in the track width direction of the MR effect multilayer 332 or at least on both sides in the track width direction of the free layer 45. Further, bias insulating layers 48 formed of a non-magnetic electrically-insulating material are provided between the respective hard bias layers 47 and the MR effect multilayer 332. The hard bias layer 47, which is a kind of permanent magnets, plays a role of stabilizing the magnetic domain structure of the free layer 45 by applying a bias magnetic field to the free layer 45, which enables the element output to be stabilized and to respond linearly to the signal magnetic field.

Generally, the spacing between the upper and lower shield layers 334 and 330 in the head end surface 300 is referred to as a read gap. Recently, the read gap is required to be narrower for the purpose of detecting an extremely local signal field caused by higher density recording. In the case, the layer thickness of the antiferromagnetic layer 42 is also required to be smaller, which, however, weakens the exchange coupling between the antiferromagnetic layer 42 and the pinned layer 43. As a result, there has been conventionally a possibility that the element output decreases and the symmetry of the output waveform is degraded due to the rotation or dispersion of the magnetization of the pinned layer 43 through the manufacturing process. According to the present invention, in order to fix stably the magnetization of the pinned layer 43 even under the condition that the read gap becomes narrower, the saturation magnetostriction constant $\lambda_S$ of the pinned layer 43 and the internal stress of the hard bias layer 47 are set up as follows.

The MR effect element 33 according to the present invention is set up to have a negative value of the product $\lambda_S \times \sigma$ where the $\lambda_S$ is a saturation magnetostriction constant of the pinned layer 43 (the first ferromagnetic film 43a and the second ferromagnetic film 43b) and the a is an internal stress on the cross-section perpendicular to the layer surface of the hard bias layer 47. For example, the pinned layer 43 is set up to have a positive value of the saturation magnetostriction constant $\lambda_S$, and the hard bias layer 47 is set up to have a compressive stress ($\sigma<0$) on the cross-section perpendicular to its layer surface. Further, in this case, it is preferable that the saturation magnetostriction constant $\lambda_S$ of the pinned layer 43 is $2\times10^{-6}$ or more and the compressive stress of the hard bias layer 47 is 520 MPa (megapascals) or more ($\sigma \leq -520$ MPa), as described in detail later. In another way of describing, it is preferable that the absolute value of the product $|\lambda_S \times \sigma|$ is 1040 J(Joules)/m$^3$ (MPa) or more. The above-described lower-limit of the saturation magnetostriction constant $\lambda_S$ is a value experimentally decided in such a way that the absolute value of the $\lambda_S$ less than the lower limit is difficult to be stably set up in the normal formation process of the pinned layer 43. By setting up the $\lambda_S$ and the $\sigma$ as described above, the magnetization of the pinned layer can be stably fixed even after going through high temperature environment, under the condition that the read gap becomes narrower.

In the conventional head in which the sign and absolute value of the internal stress of the hard bias layer are not controlled, the value of the saturation magnetostriction constant $\lambda_S$ is tentatively set up to be, for example, $9.0\times10^{-5}$ or less so that the absolute value of the magnetic anisotropy energy is reduced. On the contrary, the hard bias layers 47 according to the present invention have an internal stress with controlled sign and absolute value. Therefore, the upper limit of the saturation magnetostriction constant $\lambda_S$ of the pinned layer 43 is not needed to be taken into consideration from the aspect of the magnetic anisotropy energy.

The mode of each layer of the MR effect multilayer 332 is not limited to the above-described one. For example, the pinned layer 43 may have a monolayer structure of a ferromagnetic film, or a multilayered structure with other number of layers. The free layer 45 may have a monolayer structure without a high polarizability film, or may have a more-than-two-layered structure including a film for adjusting magnetostriction. Further, The antiferromagnetic layer, the pinned layer, the non-magnetic intermediate layer and the free layer may be stacked in the reverse order, that is, the free layer, the non-magnetic intermediate layer, the pinned layer and the antiferromagnetic layer may be stacked in this order.

Figure 4A:
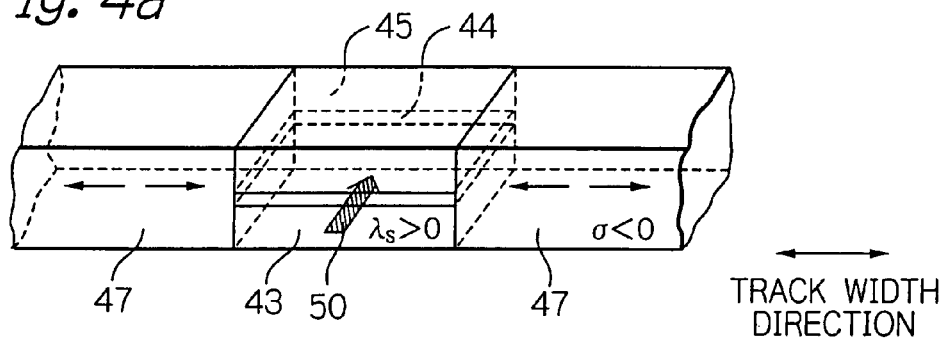
FIGS. 4a to 4d show schematic views for explaining the mechanism of stably fixing the magnetization of the pinned layer in the MR effect element according to the present invention.
Figure 4B:
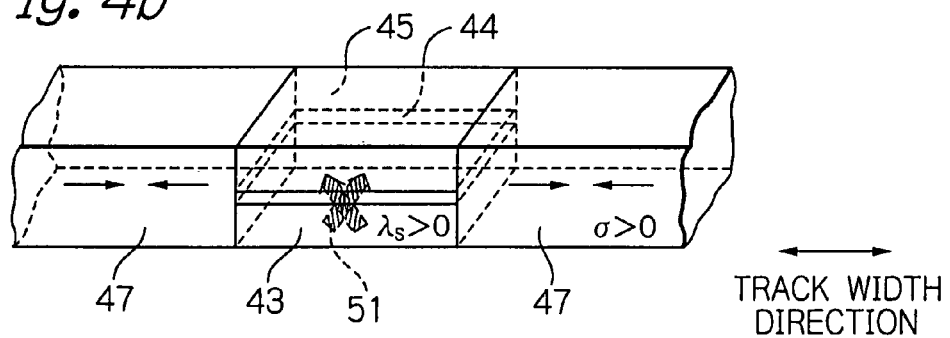
Figure 4C:
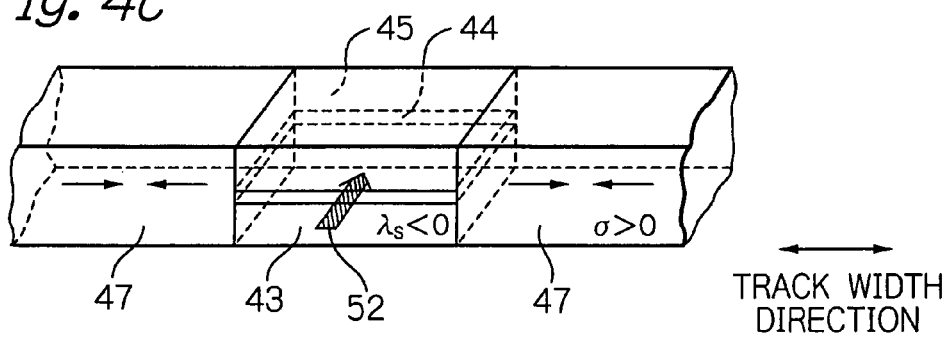
Figure 4D:
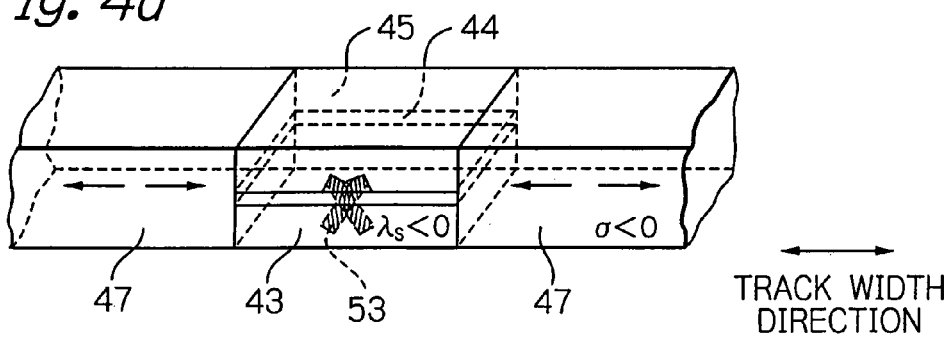

FIGS. 4a to 4d show schematic views for explaining the mechanism of stably fixing the magnetization of the pinned layer in the MR effect element according to the present invention. FIGS. 4a and 4c are in the case of the MR effect element according to the present invention, and FIGS. 4b and 4d are in the case of the comparative examples.

In FIG. 4a, the internal stress σ on the cross-section perpendicular to the layer surface of the hard bias layer 47 has a negative value, that is, is compressive. As a result, the pinned layer 43 receives a stress from the adjacent hard bias layers 47, by which the pinned layer 43 is compressed along the track width direction. Here, the pinned layer 43 has a saturation magnetostriction constant $\lambda_S$ with a positive value. Therefore, the pinned layer 43 receives an anisotropic magnetic field in-plane of its own layer and perpendicular to the track width direction due to inverse-magnetostriction effect and shape magnetic anisotropy. The direction of the anisotropic magnetic field is just the direction in which the magnetization 50 of the pinned layer 43 should be fixed through the pin-annealing process. As a result, the magnetization 50 of the pinned layer 43 is stably fixed even after going through high temperature environment such as annealing. Consequently, a sufficient element output and favorable symmetry of output waveform are surely obtained due to the stable fixing of the magnetization 50.

On the contrary, as shown in FIG. 4b, in the case that the internal stress σ of the hard bias layer 47 has a positive value, that is, is tensile, the pinned layer 43 receives a stress from the adjacent hard bias layers 47, by which the pinned layer 43 is pulled along the track width direction. Here, the pinned layer 43 also has a saturation magnetostriction constant $\lambda_S$ with a positive value as in FIG. 4a. Therefore, the pinned layer 43 receives an anisotropic magnetic field along the track width direction due to inverse-magnetostriction effect. As a result, the magnetization 51 of the pinned layer 43 has a possibility to be rotated or dispersed after going through high temperature environment such as annealing. Consequently, the rotation or dispersion of the magnetization 51 may cause the decrease in the element output and the degradation of the output waveform symmetry.

In FIG. 4c, the internal stress σ on the cross-section perpendicular to the layer surface of the hard bias layer 47 has a negative value, that is, is compressive. As a result, the pinned layer 43 receives a stress from the adjacent hard bias layers 47, by which the pinned layer 43 is compressed along the track width direction. Here, the pinned layer 43 has a saturation magnetostriction constant $\lambda_S$ with a negative value. Therefore, the pinned layer 43 receives an anisotropic magnetic field in-plane of its own layer and perpendicular to the track width direction due to inverse-magnetostriction effect and shape magnetic anisotropy. As a result, the magnetization 52 of the pinned layer 43 is stably fixed even after going through high temperature environment such as annealing as is the case of FIG. 4a.

On the contrary, as shown in FIG. 4d, in the case that the internal stress σ of the hard bias layer 47 has a positive value, that is, is tensile, the pinned layer 43 receives a stress from the adjacent hard bias layers 47, by which the pinned layer 43 is pulled along the track width direction. Here, the pinned layer 43 also has a saturation magnetostriction constant $\lambda_S$ with a negative value as in FIG. 4c. Therefore, the pinned layer 43 receives an anisotropic magnetic field along the track width direction due to inverse-magnetostriction effect. As a result, the magnetization 53 of the pinned layer 43 has a possibility to be rotated or dispersed after going through high temperature environment such as annealing.

From the above-described mechanism including inverse magnetostriction effect, it is understood that an important feature of the present invention is that the product $\lambda_S \times \sigma$ is negative, where the $\lambda_S$ is a saturation magnetostriction constant of the pinned layer 43 and the σ is an internal stress of the hard bias layer 47. Here, the stress in the pinned layer 43 which is received from the hard bias layer 47 is presumed to be equivalent or almost equivalent to the internal stress σ of the hard bias layer 47. Then, the absolute value $|E_U|$ of the magnetic anisotropy energy due to inverse-magnetostriction effect is determined to be $|(3/2) \times \lambda_S \times \sigma|$. It is preferable that the value of $|E_U|$ is 1560 J/m³ or more, as described later with practical examples.

FIGS. 5a1 to 5d2 show cross-sectional and plain views schematically illustrating an embodiment of the manufacturing method of the MR effect element according to the present invention. The cross-sections in FIGS. 5a1, 5b1, 5c1 and 5d1 are taken along line c-c in FIG. 5a2, line d-d in FIG. 5b2, line e-e in FIG. 5c2 and line f-f in FIG. 5d2, respectively. FIGS. 5a2, 5b2, 5c2 and 5d2 are plain views when the manufactured portion is viewed from the upper side of the element formation surface of a slider wafer substrate.

As shown in FIG. 5a1, first, a lower shield layer 330 made of a soft-magnetic conductive material such as NiFe, CoFeNi, CoFe, FeN or FeZrN with a thickness of approximately 0.3 to 5 μm (micrometers) is formed on/above the element formation surface of the slider wafer substrate (not shown in the figure) by using, for example, a frame plating method. Next, on the lower shield layer 330, formed is a lower metal layer 41' constituted of a lower metal film made of such as Ta, Hf, Nb, Zr, Ti, Mo or W with a thickness of approximately 0.5 to 7 nm (nanometers) and a base film made of such as NiCr or NiFe with a thickness of approximately 3 to 8 nm, by using, for example, a sputtering method. Next, on the lower base layer 41', formed is an antiferromagnetic layer 42' made of such as IrMn, PtMn, NiMn or RuRhMn with a thickness of approximately 4 to 10 nm by using, for example, a sputtering method. Then, on the antiferromagnetic layer 42', formed is a pinned layer 43' constituted of a first ferromagnetic film made of such as CoFe with a thickness of approximately 1 to 4 nm, a non-magnetic film made of such as Ru, Rh, Ir, Cr, Re or Cu with a thickness of approximately 0.5 to 2 nm, and a second ferromagnetic film made of such as CoFe with a thickness of approximately 1 to 5 nm, by using, for example, a sputtering method.

The value of the saturation magnetostriction constant $\lambda_S$ is preferably set to be, for example, a positive value of $2 \times 10^{-6}$ or more. The setting of the $\lambda_S$ can be performed by, for example, selecting composition ratio of constituent alloy.

Next, on the formed pinned layer 43', formed is a non-magnetic intermediate layer 44' made of such as Cu or Ag with a thickness of approximately 1 to 3 nm, by using, for example, a sputtering method (which is the case of the GMR effect element), or a non-magnetic intermediate layer 44' made of an oxide of a metal film such as Al, AlCu, Mg or Ti with a thickness of approximately 0.5 to 1.5 nm, by using, for example, a sputtering method (which is the case of the TMR effect element).

Then, on the formed non-magnetic intermediate layer 44', formed is a free layer 45' constituted of a high polarizability film made of, for example, CoFe with a thickness of approximately 1 nm and a soft-magnetic film made of, for example, NiFe with a thickness of approximately 3 to 4 nm, by using, for example, a sputtering method. Next, on the free layer 45', formed is the cap layer 46' made of, for example, Ta, Ru, Hf, Nb, Zr, Ti, Mo or W with a thickness of approximately 5 to 20 nm, by using, for example, a sputtering method. After that, an MR effect multilayer 60 is formed by using, for example, a sputtering method and an ion milling method, as shown in FIG. 5b1.

Next, also as shown in FIG. 5b1, on both sides in the track width direction of the MR effect multilayer 60, formed are bias insulating layers 48' made of, for example, $Al_2O_3$ or $SiO_2$ with a thickness of approximately 3 to 20 nm and hard bias layers 47' made of a hard-magnetic material such as CoPt, CoFe or CoCrPt with a thickness of approximately 3 to 20 nm, by using, for example, a sputtering method and a lift-off method. Here, the internal stress σ of the hard bias layer 47' is set up so as to be compressive when the $\lambda_S$ of the pinned layer 43 (the first and second ferromagnetic layers) has a positive value and to be tensile when the $\lambda_S$ has a negative value. The setting of the internal stress σ can be performed by, for example, adjusting the deposition condition during sputtering of the hard bias layers 47' or selecting existence-or-nonexistence or the structure of the base film (bias base film) of the hard bias layer 47'. It has become understood experimentally that a sufficiently large compressive stress with |σ| being 500 MPa or more can be obtained under the appropriate deposition condition and by using, as the bias base film, an element selected from a group of Cr, Ti, W or Mo or an alloy of at least two selected from the group.

After that, as shown in FIG. 5c1, an MR effect multilayer 61 is formed by further patterning the MR effect multilayer 60 with use of, for example, a photolithography method and an ion milling method. In this occasion, the hard bias layers 47 are also patterned to have the same height length (pattern length in the direction perpendicular to the track width direction in FIG. 5c2) as the MR effect multilayer 61. Then, an insulating layer 333 is deposited by using, for example, a sputtering method and a lift-off method. It should be noticed that the cross-section in FIG. 5b1 and the cross-section in FIG. 5c1 are orthogonal with each other.

Then, a pin-annealing process is performed so that the magnetization of the pinned layer 43 is fixed to the direction in-plane of the pinned layer 43 and perpendicular to the track width direction. In the pin-annealing process, a magnetic field of, for example, about 8 kOe (kilooersteds) (about 640 kA/m) continues to be applied to the element in the direction in-plane of the element and perpendicular to the track width direction, and the temperature of the element is increased to 250-300° C., holds the attained value, and then, is decreased. During the decrease, the magnetization of the pinned layer 43 becomes fixed to the direction in-plane of the pinned layer 43 and perpendicular to the track width direction at the time that the temperature of the element becomes lower than the blocking temperature of the antiferromagnetic layer 42.

After that, formed is an upper shield layer 334 made of a soft-magnetic conductive material such as NiFe, CoFeNi, CoFe, FeN or FeZrN with a thickness of approximately 0.3 to 4 μm, by using, for example, a frame plating method or a sputtering method so as to sandwich the MR effect multilayer with the lower shield layer 330. Next, the magnetizing process of the hard bias layers 47 is performed by applying a magnetic field of 3-12 kOe (about 240-960 kA/m). Through these processes, the thin-film wafer process of the MR effect element 33 is finished. Then, the wafer is cut into row bars, and a polishing process as an MR height process is performed. After that, the row bar is cut to be separated into individual chips, thus the MR effect element 33 (slider) is completed.

Hereinafter, practical examples of the MR effect element according to the present invention will be presented, and the influence of the annealing process on the element output will be explained.

Table 1 shows the structure of the MR effect multilayer in an MR effect element used as practical examples.

TABLE 1

| | Composition (unit of thickness: nm) |
|---|---|
| Base layer | Ta(1.0)/NiFe(2.0) |
| Antiferromagnetic layer | InMn(6.0) |
| Pinned layer | CoFe(2.0)/Ru(0.8)/CoFe(2.4) |
| Non-magnetic intermediate layer | Cu(1.5) |
| Free layer | CoFe(1.0)/NiFe(5.0) |
| Cap layer | Ta(5.0) |

The above-described MR effect element was provided with a bias insulating layer of $Al_2O_3$, a bias base film of Cr, and a hard bias layer of CoPt. On the hard bias layer, formed was Ta film. All the layers shown in Table 1, the bias insulating layer, the bias base film and the hard bias layer were formed by using a sputtering method.

The saturation magnetostriction constant $\lambda_S$ of the pinned layer was $3.5 \times 10^{-5}$. Further, as for the internal stress of the hard bias layer, three samples A, B and C shown in Table 2 were prepared.

TABLE 2

| | Internal stress (MPa) |
|---|---|
| Sample A | −200 |
| Sample B | −380 |
| Sample C | −520 |

The setting and controlling of the internal stress of the hard bias layer was performed by changing the bias power applied to the substrate side during sputtering the CoPt film. The variation of the internal stress due to the change in the bias power can be explained by the difference in the degree of mixing Ar (argon) as the process gas into deposited film.

The amount of the internal stress was obtained as follows: An equivalent hard bias layer was deposited on a glass substrate with a thickness of 0.15 mm, a length of 18 mm, a width of 2 mm, Poisson's ratio of 0.22 and Young's modulus of $7.45 \times 10^{11}$ dyn/cm², and measured was the variation of the curvature of the substrate between before and after the deposition. The calculating expression of the internal stress σ is as follows:

$$\sigma = E * b^2 * y / (3 * d * (1-\nu) * (y^2 + x^2/4)) \quad (1)$$

where E is Young's modulus of the substrate, b is a thickness of the substrate, y is the amount of the curvature variation of the substrate, d is the layer thickness of the hard bias layer, ν is Poisson's ratio of the substrate, and x is the width of the substrate.

Figure 6:
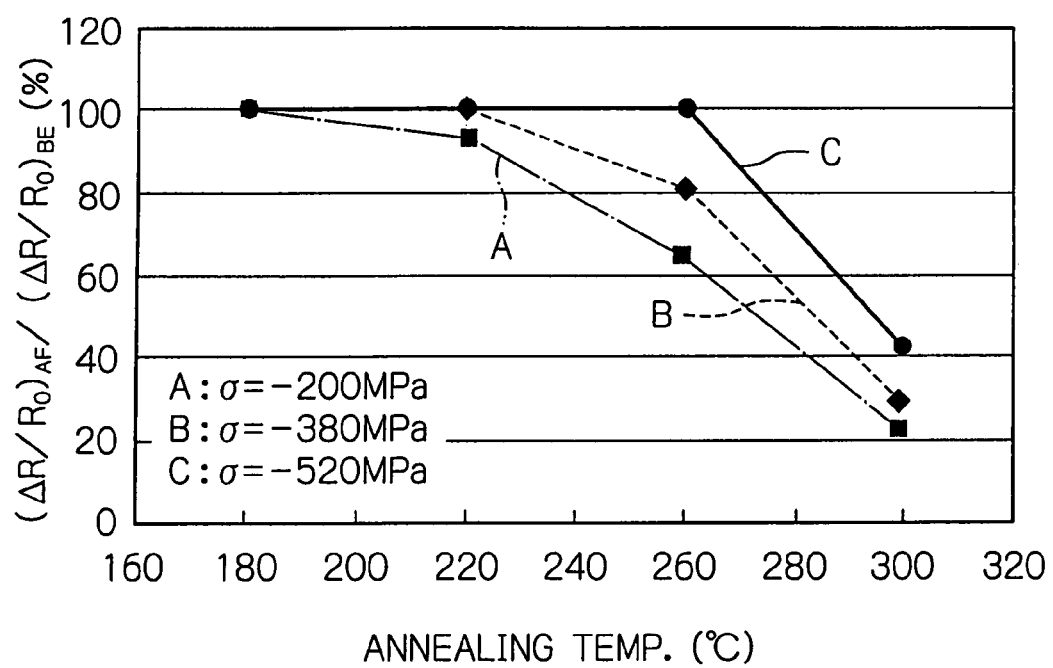
FIG. 6 shows a graph illustrating the result of measuring the variation of the resistance-change ratio between before and after annealing in samples A, B and C shown in Table 2.

FIG. 6 shows a graph illustrating the result of measuring the variation of the resistance-change ratio between before and after annealing in samples A, B and C shown in Table 2.

The horizontal axis of the graph shown in FIG. 6 is a processing temperature in the annealing process. In the measurement, each sample was annealed with the processing temperature of 180, 220, 260 and 300° C. and without applying magnetic field, and the resistance-change ratio $\Delta R/R_0$ of each sample was measured before and after the anneal process. The resistance-change ratio $\Delta R/R_0$ is defined as a ratio between the maximum resistance variation $\Delta R$ due to applying magnetic field and the element resistance $R_0$.

The vertical axis of the graph is a ratio in percent between the resistance-change ratio $(\Delta R/R_0)_{AF}$ after the annealing and the resistance-change ratio $(\Delta R/R_0)_{BE}$ before the annealing. The lower than 100% the ratio becomes, the more the element output is decreased due to the annealing.

In advance, the ratio $(\Delta R/R_0)_{AF}/(\Delta R/R_0)_{BE}$ was measured in multiple numbers of respective samples A, B and C having a non-patterned film shape without hard bias layers. As a result, the ratio $(\Delta R/R_0)_{AF}/(\Delta R/R_0)_{BE}$ became lower than 100%, that is, the element output was decreased, in all the samples A, B and C annealed with temperatures 250-270° C. or more and without applying magnetic field. According to the result, it is understood that the exchange coupling at the IrMn/CoFe interface of samples A, B and C is substantially vanished in temperatures 250-270° C. or more.

As shown in FIG. 6, after annealing with 180° C., the ratio $(\Delta R/R_0)_{AF}/(\Delta R/R_0)_{BE}$ keeps 100% in all the samples A, B and C, which shows no decrease in the element output. However, in the case of annealing with 220° C., sample A, which has a minimum absolute value of the stress, has a decreased element output. In the case of annealing with 260° C., the element output of sample A is further decreased to about 60% of that before annealing, and also decreased is the element output of sample B which has a second minimum absolute value of the stress. On the contrary, sample C keeps 100% of the ratio $(\Delta R/R_0)_{AF}/(\Delta R/R_0)_{BE}$ even after annealing with 260° C., which shows no decrease in the element output. Therefore, it is understood that sample C with a maximum absolute value of the stress ($\sigma=-520$ MPa) has a temperature tolerance comparable with that in the case of the above-described non-patterned film shape.

Consequently, it is preferable that the hard bias layer has a compressive stress on the cross-section perpendicular to its own layer surface, the absolute value of which is at least 520 MPa or more. Here, The saturation magnetostriction constant $\lambda_S$ of the pinned layer is set to be at least $2\times10^6$ or more, and the stress in the pinned layer that is received from the hard bias layer is presumed to be equivalent or almost equivalent to the internal stress of the hard bias layer. Then, it is preferable that the absolute value $|E_U|$ of the magnetic anisotropy energy due to inverse-magnetostriction effect in the direction in-plane of the pinned layer and perpendicular to the track width direction is at least: $|(3/2)\times\lambda_S\times\sigma|=(3/2)\times(2\times10^{-6})\times(520\times10^6)=1560$ J/m³.

Further, In the present experiment, prepared were five samples having a height length of the MR effect multilayer (a pattern length in the direction perpendicular to the track width direction in FIG. 5c2) of 0.1, 0.2, 0.3, 0.4 and 0.5 µm, and examined was the relation of the height length and the variation of the resistance-change ratio between before and after annealing.

Generally, the larger the height length becomes, the exchange magnetic field working on the interface between the antiferromagnetic layer and the pinned layer has higher intensity due to the influence of shape magnetic anisotropy. However, as the experimental result, there was no difference among the samples with various height lengths in the degree of the output decrease by the annealing (in the degree of the variation of the resistance-change ratio between before and after annealing). This is considered to be because, in the formation process defining the height length shown in FIGS. 5c1 and 5c2, a hard bias layer with the same height length as the MR effect multilayer is formed adjacent to the MR effect multilayer. That is, the stress received from the hard bias layer works over the whole side surfaces of the MR effect multilayer regardless of the amount of the height length. As a result, the stress is considered to have a decisive influence on the magnetization direction of the pinned layer during annealing.

Therefore, it is understood that, in order to fix the magnetization of the pinned layer stably, controlling the stress received from the adjacent hard bias layer is more important than adjusting the height length of the MR effect multilayer.

Further, as shown in, for example, Japanese Patent Publications Nos. 2005-346869A and 2005-44490A, proposed is an element in which the height lengths of the antiferromagnetic layer and the pinned layer are set to be larger than those of the free layer and the hard bias layer. However, compared to the element, the MR effect element according to the present invention in which the stress received from the adjacent hard bias layer is controlled as described above is more effective in fixing the magnetization of the pinned layer stably, and can be produced with less man-hour.

All the foregoing embodiments are by way of example of the present invention only and not intended to be limiting, and many widely different alternations and modifications of the present invention may be constructed without departing from the spirit and scope of the present invention. In fact, the MR effect element according to the present invention has applicability to magneto-sensitive parts of magnetic sensors, magnetic switches, magnetic encoders and so on, as well as the read head element of the thin-film magnetic head. Accordingly, the present invention is limited only as defined in the following claims and equivalents thereto.

The invention claimed is:

1. A magnetoresistive effect element comprising:
a non-magnetic intermediate layer formed of a non-magnetic material;
a pinned layer formed of a ferromagnetic material and a free layer formed of a ferromagnetic material, said pinned layer and said free layer stacked so as to sandwich said non-magnetic intermediate layer;
an antiferromagnetic layer stacked to have a surface contact with said pinned layer, for fixing a magnetization of said pinned layer to a direction in-plane of said pinned layer and perpendicular to a track width direction; and
hard bias layers provided on both sides in the track width direction of said free layer, for applying a bias field to said free layer,
a product $\lambda_S\times\sigma$ of a saturation magnetostriction constant $\lambda_S$ of said pinned layer and an internal stress $\sigma$ on a cross-section perpendicular to a layer surface of said hard bias layer being negative.

2. The magnetoresistive effect element as claimed in claim 1, wherein an absolute value $|\lambda_S\times\sigma|$ of said product $\lambda_S\times\sigma$ is 1040 J/m³ or more.

3. The magnetoresistive effect element as claimed in claim 1, wherein said pinned layer has a positive saturation magnetostriction constant $\lambda_S$, and said hard bias layer has a compressive internal stress on a cross-section perpendicular to the layer surface.

4. The magnetoresistive effect element as claimed in claim 3, wherein said positive saturation magnetostriction constant $\lambda_S$ of said pinned layer is $2\times10^{-6}$ or more, and said compressive internal stress of said hard bias layer has an absolute value of 520 MPa or more.

5. The magnetoresistive effect element as claimed in claim 1, wherein bias insulating layers formed of a non-magnetic electrically-insulating material are provided between respective said hard bias layers and a multilayer of said pinned layer, said non-magnetic intermediate layer and said free layer.

6. The magnetoresistive effect element as claimed in claim 1, wherein a bias base film formed of an element selected from a group of Cr, Ti, W or Mo or an alloy of at least two selected from said group is provided as a base of said hard bias layer.

7. The magnetoresistive effect element as claimed in claim 1, wherein said magnetoresistive effect element is a current-perpendicular-to-plane giant magnetoresistive effect element or a tunnel magnetoresistive effect element, in which a sense current flows in a direction perpendicular to surfaces of stacked layers of the element.

8. A thin-film magnetic head comprising a magnetoresistive effect element for reading data comprising:
   a non-magnetic intermediate layer formed of a non-magnetic material;
   a pinned layer formed of a ferromagnetic material and a free layer formed of a ferromagnetic material, said pinned layer and said free layer stacked so as to sandwich said non-magnetic intermediate layer;
   an antiferromagnetic layer stacked to have a surface contact with said pinned layer, for fixing a magnetization of said pinned layer to a direction in-plane of said pinned layer and perpendicular to a track width direction; and
   hard bias layers provided on both sides in the track width direction of said free layer, for applying a bias field to said free layer,
   a product $\lambda_S \times \sigma$ of a saturation magnetostriction constant $\lambda_S$ of said pinned layer and an internal stress $\sigma$ on a cross-section perpendicular to a layer surface of said hard bias layer being negative.

9. The thin-film magnetic head as claimed in claim 8, wherein an absolute value $|\lambda_S \times \sigma|$ of said product $\lambda_S \times \sigma$ is 1040 J/m$^3$ or more.

10. The thin-film magnetic head as claimed in claim 8, wherein said pinned layer has a positive saturation magnetostriction constant $\lambda_S$, and said hard bias layer has a compressive internal stress on a cross-section perpendicular to the layer surface.

11. The thin-film magnetic head as claimed in claim 10, wherein said positive saturation magnetostriction constant $\lambda_S$ of said pinned layer is $2 \times 10^{-6}$ or more, and said compressive internal stress of said hard bias layer has an absolute value of 520 MPa or more.

12. The thin-film magnetic head as claimed in claim 8, wherein bias insulating layers formed of a non-magnetic electrically-insulating material are provided between respective said hard bias layers and a multilayer of said pinned layer, said non-magnetic intermediate layer and said free layer.

13. The thin-film magnetic head as claimed in claim 8, wherein a bias base film formed of an element selected from a group of Cr, Ti, W or Mo or an alloy of at least two selected from said group is provided as a base of said hard bias layer.

14. The thin-film magnetic head as claimed in claim 8, wherein said magnetoresistive effect element is a current-perpendicular-to-plane giant magnetoresistive effect element or a tunnel magnetoresistive effect element, in which a sense current flows in a direction perpendicular to surfaces of stacked layers of the element.

15. A head gimbal assembly comprising: a thin-film magnetic head comprising a magnetoresistive effect element for reading data; signal lines for said magnetoresistive effect element; and a support means for supporting said thin-film magnetic head,
   said magnetoresistive effect element comprising:
   a non-magnetic intermediate layer formed of a non-magnetic material;
   a pinned layer formed of a ferromagnetic material and a free layer formed of a ferromagnetic material, said pinned layer and said free layer stacked so as to sandwich said non-magnetic intermediate layer;
   an antiferromagnetic layer stacked to have a surface contact with said pinned layer, for fixing a magnetization of said pinned layer to a direction in-plane of said pinned layer and perpendicular to a track width direction; and
   hard bias layers provided on both sides in the track width direction of said free layer, for applying a bias field to said free layer,
   a product $\lambda_S \times \sigma$ of a saturation magnetostriction constant $\lambda_S$ of said pinned layer and an internal stress $\sigma$ on a cross-section perpendicular to a layer surface of said hard bias layer being negative.

16. A magnetic recording/reproducing apparatus comprising: at least one head gimbal assembly comprising a thin-film magnetic head comprising a magnetoresistive effect element for reading data; at least one magnetic recording medium; and a recording/reproducing means for controlling read and write operations of said thin-film magnetic head to said at least one magnetic recording medium,
   said head gimbal assembly comprising signal lines for said magnetoresistive effect element and a support means for supporting said thin-film magnetic head,
   said magnetoresistive effect element comprising:
   a non-magnetic intermediate layer formed of a non-magnetic material;
   a pinned layer formed of a ferromagnetic material and a free layer formed of a ferromagnetic material, said pinned layer and said free layer stacked so as to sandwich said non-magnetic intermediate layer;
   an antiferromagnetic layer stacked to have a surface contact with said pinned layer, for fixing a magnetization of said pinned layer to a direction in-plane of said pinned layer and perpendicular to a track width direction; and
   hard bias layers provided on both sides in the track width direction of said free layer, for applying a bias field to said free layer,
   a product $\lambda_S \times \sigma$ of a saturation magnetostriction constant $\lambda_S$ of said pinned layer and an internal stress $\sigma$ on a cross-section perpendicular to a layer surface of said hard bias layer being negative.

\* \* \* \* \*